United States Patent
Balana Avila et al.

(10) Patent No.: US 11,277,927 B2
(45) Date of Patent: Mar. 15, 2022

(54) SYSTEM AND METHOD FOR MOUNTING AN ELECTRONICS ARRANGEMENT

(71) Applicant: LEAR CORPORATION, Southfield, MI (US)

(72) Inventors: Joan Balana Avila, Valls (ES); Joan Ignasi Ferran Palau, Valls (ES); Oscar Cano Salomo, Valls (ES); Xavier Blas Morales, Valls (ES); Jose Gabriel Fernandez, Valls (ES)

(73) Assignee: Lear Corporation, Southfield, MI (US)

( * ) Notice: Subject to any disclaimer, the term of this patent is extended or adjusted under 35 U.S.C. 154(b) by 115 days.

(21) Appl. No.: 16/674,593

(22) Filed: Nov. 5, 2019

(65) Prior Publication Data

US 2021/0136937 A1 May 6, 2021

(51) Int. Cl.
*H05K 5/00* (2006.01)
*H05K 5/03* (2006.01)

(52) U.S. Cl.
CPC .............. *H05K 5/0069* (2013.01); *H05K 5/03* (2013.01)

(58) Field of Classification Search
CPC ...... H05K 5/03; H05K 5/0069; H05K 5/0026; H05K 5/0043; H05K 5/0047; H05K 5/0056; H05K 5/006
See application file for complete search history.

(56) References Cited

U.S. PATENT DOCUMENTS

| | | | | |
|---|---|---|---|---|
| 5,120,151 | A | * | 6/1992 | Farris ..................... E05F 11/445 403/24 |
| 5,285,353 | A | * | 2/1994 | Buck ...................... H05K 7/142 174/250 |
| 5,550,712 | A | * | 8/1996 | Crockett ................ H05K 7/142 174/564 |

(Continued)

FOREIGN PATENT DOCUMENTS

| | | |
|---|---|---|
| CN | 1126892 A | 7/1996 |
| CN | 101626668 A | 1/2010 |

(Continued)

OTHER PUBLICATIONS

Bollhoff, Vibration and noise-decoupling joining and fastening system SNAPLOC, retrieved from https://www.boelhoff.com/de-en/products-and-services/special-fasteners/decoupling-fasteners-snaploc.php on Jun. 4, 2019.

(Continued)

*Primary Examiner* — Abhishek M Rathod
*Assistant Examiner* — Keith DePew
(74) *Attorney, Agent, or Firm* — Brooks Kushman P.C.

(57) ABSTRACT

A system and method for mounting an electronics structure may include attaching a circuit assembly to a first support structure such that the circuit assembly is movable relative to the first support structure. It may also include at least partially covering the circuit assembly with a cover and moving the circuit assembly such that a predetermined portion of the circuit assembly is aligned with a predeter- (Continued)

mined portion of the cover. It may further include moving the cover such that the cover is attachable to a second support structure, and attaching the cover to the second support structure such that the predetermined portion of the circuit assembly remains aligned with the predetermined portion of the cover.

10 Claims, 4 Drawing Sheets

(56) References Cited

U.S. PATENT DOCUMENTS

| | | | | |
|---|---|---|---|---|
| 5,580,204 | A * | 12/1996 | Hultman | F16B 5/065 24/297 |
| 5,685,682 | A * | 11/1997 | Glime | F16B 21/082 411/510 |
| 6,206,604 | B1 * | 3/2001 | Dembowsky | F16B 21/075 403/122 |
| 6,282,093 | B1 | 8/2001 | Goodwin | |
| 6,399,888 | B1 * | 6/2002 | Chen | H05K 7/142 174/138 G |
| 7,168,879 | B2 * | 1/2007 | Bertram | F16B 21/073 403/132 |
| 7,226,233 | B2 * | 6/2007 | Sußenbach | F16B 21/186 403/122 |
| 7,227,761 | B2 * | 6/2007 | Estes | H05K 7/142 174/138 D |
| 7,331,801 | B1 * | 2/2008 | Eichorn | H01R 12/724 439/76.1 |
| 7,443,689 | B2 * | 10/2008 | Chan | H05K 7/142 174/138 G |
| 7,760,514 | B2 * | 7/2010 | Latal | H05K 7/142 361/804 |
| 7,938,004 | B1 * | 5/2011 | Brunsch, Jr | G01C 21/16 73/509 |
| 7,983,057 | B2 * | 7/2011 | Zheng | H05K 7/142 361/810 |
| 8,116,101 | B2 * | 2/2012 | Chang | G06F 1/1656 361/810 |
| 8,179,681 | B2 * | 5/2012 | Aoki | H05K 3/301 361/741 |
| 8,493,722 | B2 * | 7/2013 | Chien | H05K 5/0204 361/679.21 |
| 8,627,564 | B2 * | 1/2014 | Blossfeld | H05K 7/1428 29/883 |
| 8,644,028 | B2 * | 2/2014 | Qin | H05K 5/0217 361/758 |
| 8,757,025 | B2 * | 6/2014 | Terradas Prat | F16H 59/105 74/473.28 |
| 9,282,658 | B1 | 3/2016 | Tsai et al. | |
| 9,295,171 | B2 * | 3/2016 | Blossfeld | H01R 13/6658 |
| 9,458,868 | B2 * | 10/2016 | Metten | F16B 5/0621 |
| 9,504,172 | B2 * | 11/2016 | Raschilla | H05K 5/0008 |
| 9,955,596 | B2 | 4/2018 | Voss et al. | |
| 10,111,353 | B2 * | 10/2018 | Ferran Palau | H02G 3/08 |
| 10,167,890 | B2 * | 1/2019 | Steffenfauseweh | F16B 21/075 |
| 10,178,782 | B2 * | 1/2019 | Gunes | H05K 5/0069 |
| 10,288,098 | B2 * | 5/2019 | Meyers | F16B 5/0628 |
| 10,811,805 | B2 * | 10/2020 | Yamanaka | H01R 13/6581 |
| 2003/0161110 | A1 * | 8/2003 | Spasevski | H05K 7/20854 361/715 |
| 2003/0199195 | A1 * | 10/2003 | Koehler | H01R 12/724 439/541.5 |
| 2004/0262471 | A1 * | 12/2004 | Mayer | H05K 5/0073 248/218.4 |
| 2005/0047860 | A1 * | 3/2005 | Deas | H05K 7/142 403/397 |
| 2005/0057865 | A1 | 3/2005 | Veloo et al. | |
| 2005/0092869 | A1 * | 5/2005 | Vandertol | B60R 11/02 248/27.1 |
| 2006/0077642 | A1 * | 4/2006 | Estes | H05K 7/142 361/752 |
| 2007/0009342 | A1 * | 1/2007 | Figge | F16B 5/025 411/546 |
| 2007/0031185 | A1 * | 2/2007 | Bertram | F16C 11/0657 403/122 |
| 2008/0310138 | A1 * | 12/2008 | Arends | H05K 7/142 361/808 |
| 2010/0142166 | A1 * | 6/2010 | Chang | G06F 1/1616 361/759 |
| 2010/0264572 | A1 * | 10/2010 | Konkle | F16F 1/38 267/182 |
| 2013/0125360 | A1 * | 5/2013 | Boivin | B21J 15/043 29/283.5 |
| 2015/0109743 | A1 * | 4/2015 | Chang | H05K 9/0018 361/752 |
| 2015/0171608 | A1 * | 6/2015 | Ueyama | B60R 16/0238 174/50 |
| 2016/0183394 | A1 * | 6/2016 | Raschilla | H05K 5/0056 361/752 |
| 2017/0079154 | A1 * | 3/2017 | Gunes | H05K 5/0069 |
| 2019/0154073 | A1 * | 5/2019 | Figge | F16B 5/0258 |
| 2019/0164878 | A1 | 5/2019 | Hattori et al. | |
| 2020/0008312 | A1 * | 1/2020 | Jagoda | H05K 5/0034 |
| 2020/0070755 | A1 * | 3/2020 | Yuki | H01R 13/6215 |
| 2020/0388968 | A1 * | 12/2020 | Kishibata | H05K 5/0069 |

FOREIGN PATENT DOCUMENTS

| | | |
|---|---|---|
| CN | 104134932 A | 11/2014 |
| CN | 109586087 A | 4/2019 |
| JP | 2005268942 A | 9/2005 |
| WO | 0017721 | 3/2000 |
| WO | 2013041210 A2 | 3/2013 |

OTHER PUBLICATIONS

Bollhoff, Vibration and noise-decoupling joining and fastening system SNAPLOC, retrieved from https://www.boelhoff.com/de-en/products-and-services/special-fasteners/decoupling-fasteners-snaploc. php#detaillink796-7 on Jun. 4, 2019.
Bollhoff, Snaploc Vibration and noise-decoupling fastening systems Brochure.
Office Action re CN App. No. 202011094758.8 dated Nov. 30, 2021.

* cited by examiner

SYSTEM AND METHOD FOR MOUNTING AN ELECTRONICS ARRANGEMENT

TECHNICAL FIELD

The present disclosure relates to a system and method for mounting an electronics arrangement.

BACKGROUND

Many products today rely on electronics as part of their functionality. This may be particularly true in a complex system such as an automotive vehicle. Various electronics arrangements such as printed-circuit boards, fuse boxes, controllers, and various types of electronics modules may be used throughout the vehicle to perform many different tasks related to the vehicle operation. In some cases, an electronics arrangement, such as a fuse box or other module, may be hinged at one location and attached with a fastener at another location to secure it to a support structure such as a bracket or housing. Depending on the application, it may be necessary to align the electronics arrangement with an opening in a wall or other portion of a housing so that a connector or other part of the electronics arrangement is accessible from outside of the wall or housing. In an application where there is very limited space for the electronics arrangement, which may need to be shared with other modules and electronics arrangements, there is an increased opportunity for misalignment between the connector or other part of the electronics arrangement in the opening in the wall or other part of the housing. Requiring extremely tight tolerances on size and fit is often time-consuming and costly, and is therefore undesirable. Therefore, a need exists for a system and method for mounting an electronics arrangement that overcomes some or all of the limitations of existing systems and methods.

SUMMARY

Embodiments described herein may include a system for mounting an electronics arrangement having a circuit assembly including a plurality of electronic devices. The system may also include a first support structure for mounting the circuit assembly thereto, a second support structure, and a first mounting arrangement attached to the circuit assembly and the first support structure. A second mounting arrangement may cover at least a portion of the circuit assembly and be attached to the second support structure. The first mounting arrangement may include a flexible attachment connecting the circuit assembly and the first support structure such that the circuit assembly is movable relative to the first support structure to facilitate alignment of the circuit assembly with the second mounting arrangement when the second mounting arrangement is attached to the second support structure.

Embodiments described herein may include a system for mounting an electronics arrangement having a circuit assembly including a plurality of electronic devices, and a first support structure for mounting the circuit assembly thereto. A first attachment arrangement may connect the circuit assembly and the first support structure and be configured to allow at least lateral movement of the circuit assembly relative to the first support structure. The system may also include a second support structure and a second attachment arrangement connected to the second support structure and configured to inhibit movement of the circuit assembly.

Embodiments described herein may include a method for mounting an electronics arrangement. The method may include attaching a circuit assembly to a first support structure such that the circuit assembly is movable relative to the first support structure, and at least partially covering the circuit assembly with a cover. The circuit assembly may be moved such that a predetermined portion of the circuit assembly is aligned with a predetermined portion of the cover. The cover may be moved such that the cover is attachable to a second support structure, and the cover may be attached to the second support structure such that the predetermined portion of the circuit assembly remains aligned with the predetermined portion of the cover.

DETAILED DESCRIPTION

As required, detailed embodiments of the present invention are disclosed herein; however, it is to be understood that the disclosed embodiments are merely exemplary of the invention that may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ the present invention.

Figure 1:
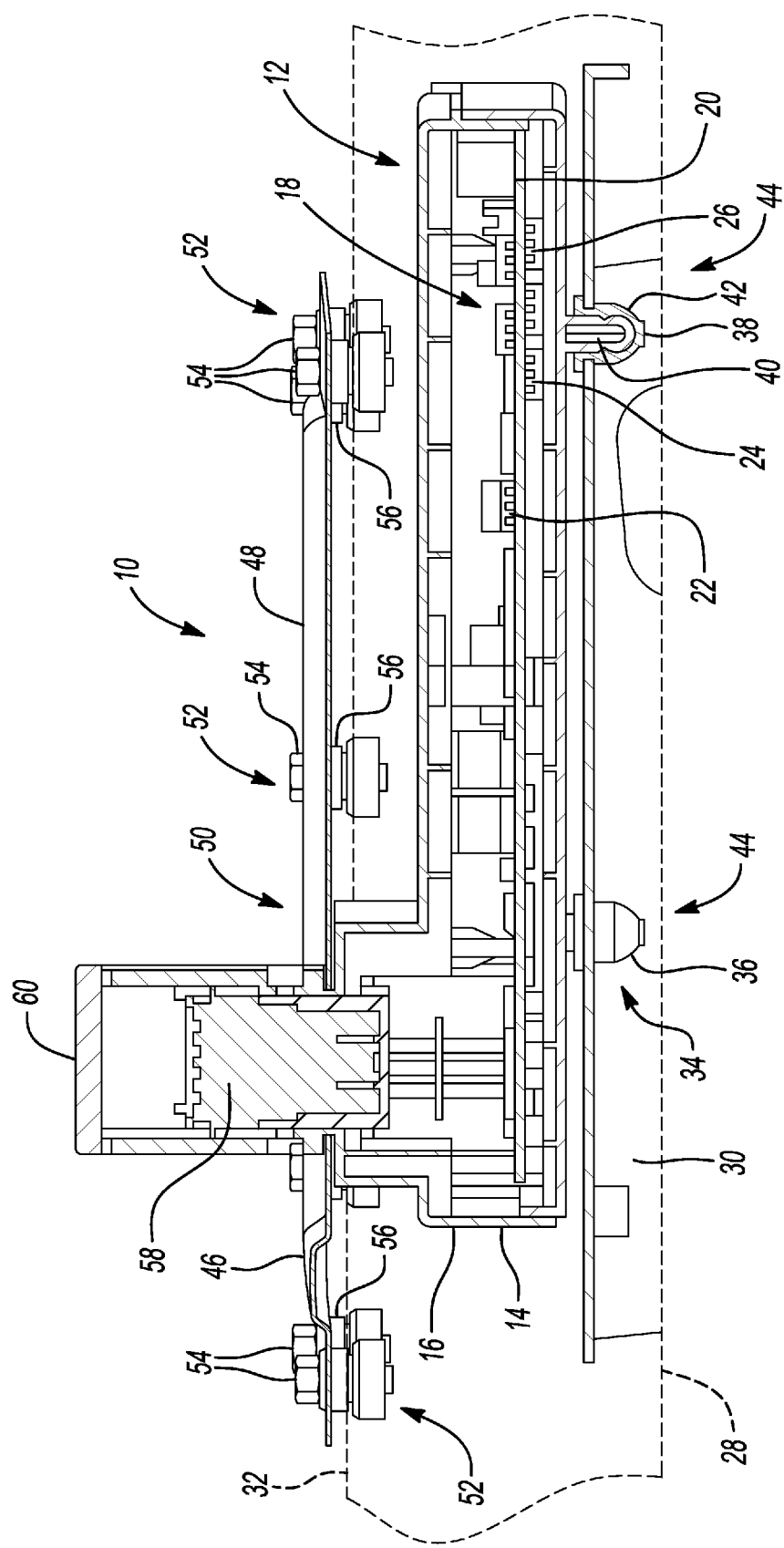
FIG. 1 shows a side view of a system for mounting an electronics arrangement in accordance with embodiments described herein.

FIG. 1 shows a system 10 for mounting an electronics arrangement in accordance with embodiments described herein. An electronics arrangement 12 includes an electronics module 14, which may be, for example, a controller used as part of a high-voltage or low-voltage system in a vehicle. The electronics module 14 includes a module housing 16, which contains a circuit assembly 18. The circuit assembly 18 shown in FIG. 1 includes a printed-circuit board 20, which has a number of electronic devices 22, 24, 26 attached thereto, not all of which are labeled in FIG. 1. The electronic devices 22, 24, 26, and the other electronic devices not labeled, may include processors, memory storage, operational amplifiers, rectifiers, etc. As commonly required in certain applications, the electronics arrangement 12, including electronics module 14 and the circuit assembly 18, may need to be mounted inside a housing 28, shown in phantom in FIG. 1. In certain applications it is necessary to provide a water-tight enclosure for a circuit assembly, which in this embodiment, the housing 28 provides. Although the line depicting the housing 28 is shown in FIG. 1 as completely surrounding the module 14, it is representative of a cross section of the housing 28, which will have an opening into which the module 14 can be placed.

The housing 28 includes a base 30, which provides a first support structure for mounting the circuit assembly 18. As explained in more detail below, an upper portion 32 of the housing 28 provides a second support structure, and although the base 30 and the upper portion 32 are part of the same housing 28, it may be convenient to consider the base 30 and the upper portion 32 as separate support structures. A first mounting arrangement 34 is attached to the circuit assembly 18 and the base 30 of the housing 28. The first mounting arrangement 34 includes flexible attachments 36, 38, and may include one or more other flexible attachments also attached to the circuit assembly 18 and the base 30 of the housing 28. Using the flexible attachment 38 as an example—it is shown in cross section in FIG. 1—it includes an elongated member 40 disposed within a coupling 42, which may be made from, for example, an elastomeric material.

The elongated member 40 is attached to the module housing 16, and may be integrally molded with the module housing 16 or attached in a separate operation. The coupling 42 is disposed in the base 30 of the housing 28 and is configured to receive the elongated member 40 and provide a generally flexible attachment between the module 14—and therefore the circuit assembly 18—and the base 30. The coupling 42 may be made from a material having a durometer of 60-80 Shore A, although materials having durometers outside this range may also be used if they provide the desired flexibility. The choice of materials, for example, for a coupling such as the coupling 42 may depend on a number of factors, including the weight of the electronics module being mounted. The flexible attachment 36, and any other associated flexible attachments, may also include an elongated member attached to the module housing 16 and disposed in a respective coupling.

The flexible attachments 36, 38 and any other associated flexible attachments may comprise a first attachment arrangement 44 for connecting the circuit assembly 18 to the first support structure or base 30. The first attachment arrangement 44 is configured to allow at least lateral movement—i.e., left and right as shown in FIG. 1—of the circuit assembly 18 relative to the base 30. As explained in more detail below, this may be convenient for providing proper alignment of the circuit assembly 18 with a second mounting arrangement 46. In the embodiment shown in FIG. 1, the second mounting arrangement 46 includes a housing cover 48, which covers at least a portion of the module 14, and therefore the circuit assembly 18, and is attached to the second support structure or upper portion 32 of the housing 28.

In the embodiment shown in FIG. 1, the housing cover 48 is part of a second attachment arrangement 50, which is connected to the upper portion 32 of the housing 28 and is configured to inhibit movement of the circuit assembly 18, which is typically a requirement to maintain a water-tight seal. Thus, the circuit assembly 18 includes a flexible connection provided by the first attachment arrangement 44 and a second more rigid connection provided by the second attachment arrangement 50. In the embodiment shown in FIG. 1, the housing cover 48 is attached to the housing 28 with a number of fastening arrangements 52, each of which includes a threaded fastener 54. An elastomeric seal 56 is positioned between the housing cover 48 and the upper portion 32 of the housing 28, and runs along the entire perimeter of the cover 48. As described above, the circuit assembly 18 includes a number of electronic devices, which in this embodiment includes an electrical connector 58. The housing cover 48 includes an aperture 60 through which the electrical connector 58 can be accessed even after the housing cover 48 is attached to the housing 28.

The elements of FIG. 1 may be conveniently used to illustrate a method in accordance with embodiments described herein. For example, the circuit assembly 18 may be attached to the housing 28 such that it is movable relative to the housing 28. This is facilitated by using a first attachment arrangement 44 that is flexible and allows the circuit assembly 18 to be moved relative to the housing 28. In at least one embodiment, the circuit assembly 18 may be at least partially covered with the housing cover 48 so that a predetermined portion of the circuit assembly 18—for example, the electrical connector 58—is aligned with a predetermined portion of the housing cover 48, such as the aperture 60. To accomplish this alignment, the circuit assembly 18 may be moved—as much as allowed by the flexible attachments 36, 38—or alternatively, the housing cover 48 may be placed over the circuit assembly 18 first, and then the housing cover 48 and the circuit assembly 18 moved together until the housing cover 48 is attachable to the housing 28. In the embodiment shown in FIG. 1, this will occur when the threaded fasteners 54 align with mounting holes in the upper portion 32 of the housing 28. The housing cover 48 can then be attached to the housing 28 so that the electrical connector 58 remains aligned with the aperture 60 in the housing cover 48.

Figure 2:
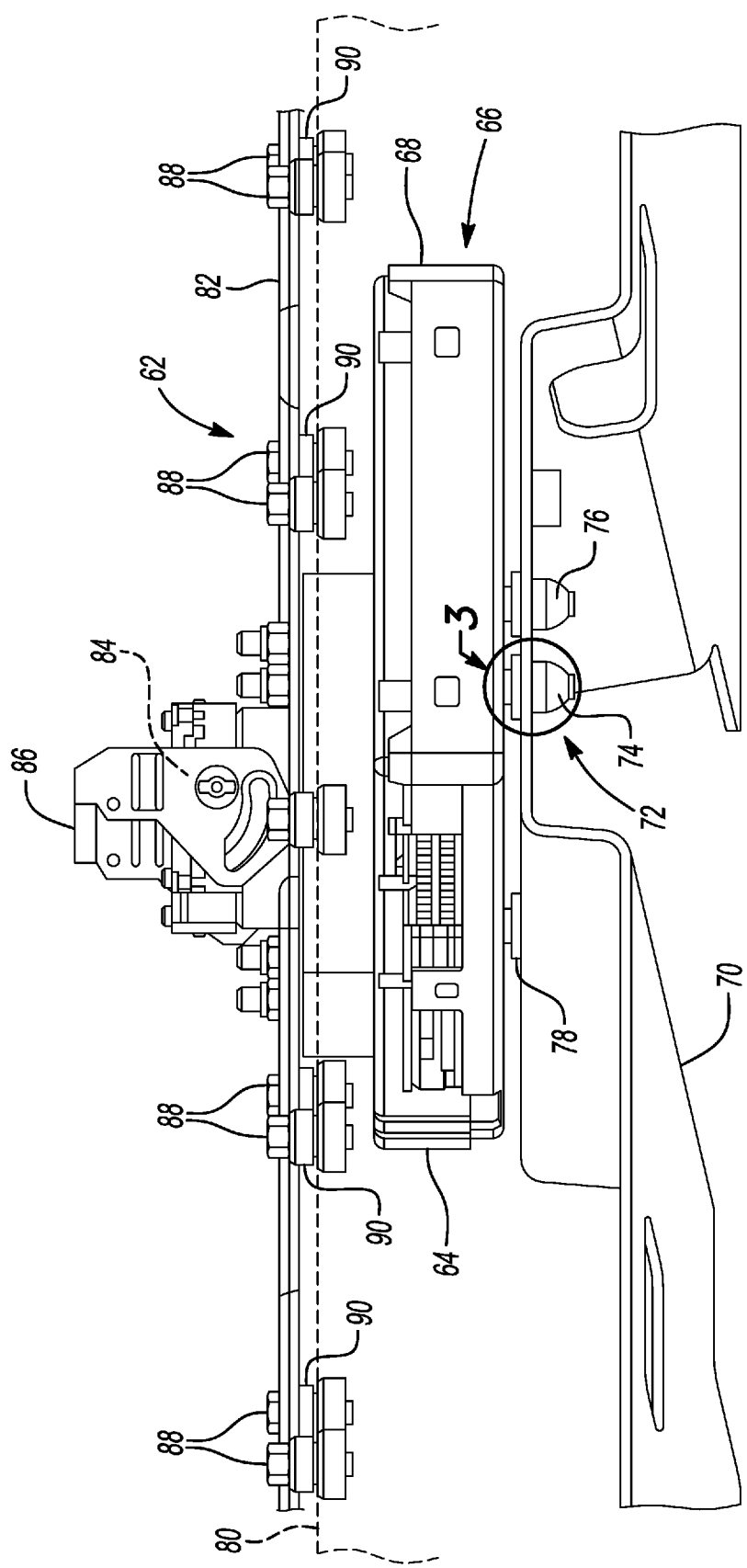
FIG. 2 shows a side view of a system for mounting an electronics arrangement in accordance with embodiments described herein.

In the embodiment shown in FIG. 1, the first support structure 30 and the second support structure 32 are both part of the same overall structure—i.e., the housing 28. In the embodiment shown in FIG. 2, the first and second support structures are separate elements. FIG. 2 shows a system 62 for mounting an electronics arrangement in accordance with embodiments described herein. The system 62 includes a circuit assembly 64 that is part of an electronics module 66 that includes a module housing 68. A bracket 70 provides a first support structure for mounting the circuit assembly 64. The bracket 70 may be part of a larger frame structure, for example, inside a battery compartment, or it may be separately attached to another portion of a vehicle, such as a portion of the body-in-white. The system 62 includes a first mounting arrangement 72 that includes flexible attachments 74, 76, 78, and may include one or more other similar flexible attachments connecting the circuit assembly 64 and the bracket 70.

Figure 3:
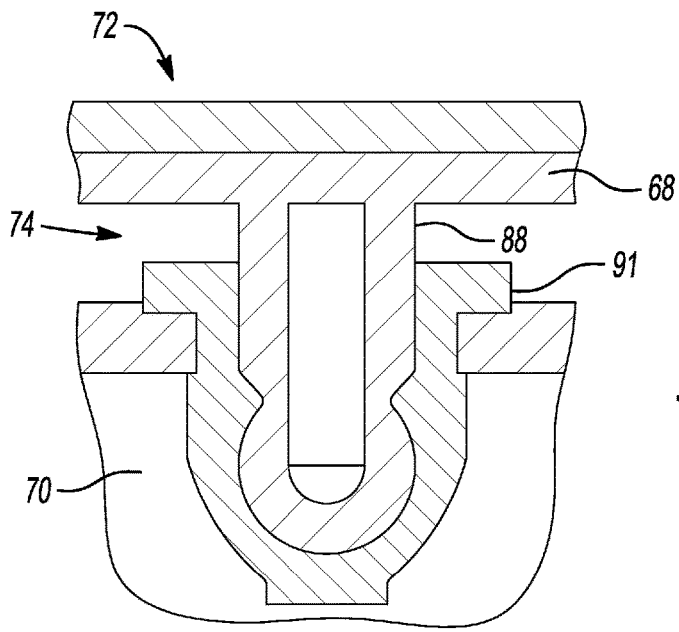
FIG. 3 shows a detailed view of a mounting arrangement from the system shown in FIG. 2.

Similar to the embodiment shown in FIG. 1, the flexible attachments 74, 76, 78 may comprise a first attachment arrangement that includes an elongated member attached to the module housing 68 and a coupling disposed in the bracket 70—see the detailed view of the flexible attachment 74 shown in FIG. 3. The system 62 also includes a second support structure 80 shown in phantom in FIG. 2, which may also be a bracket or part of a frame structure of a vehicle. A second attachment arrangement 82 is configured as a plate and functions as a cover for the circuit assembly 64. The circuit assembly 64 includes a plurality of electronic devices, including an electrical connector 84 positioned under a portion of the cover 82. The cover 82 includes an aperture 86 that is configured to align with a predetermined one of the electronic devices on the circuit assembly 64, which in this case is the electrical connector 84. As shown in FIG. 2, the cover 82 is attached to the bracket 80 with threaded fasteners 88. An elastomeric seal 90 is positioned between the cover 88 and the bracket 80, and runs along the entire perimeter of the cover 80.

The flexible attachments 74, 76, 78 allow the circuit assembly 64 to be moved relative to the bracket 70 after it is attached to the bracket 70, which facilitates alignment with the cover 82, and in particular, facilitates alignment of the electrical connector 84 with the aperture 86 in the cover 82. Similar to the embodiment shown in FIG. 1, the circuit assembly 64 may be flexibly mounted to the bracket 70 and then moved to a position of alignment with the cover 82. Alternatively, the circuit assembly 64 may be mounted to the bracket 70 and then the cover 82 placed over the circuit assembly 64 so the electrical connector 84 is aligned with the aperture 86. Then, the cover 82 and the circuit assembly 64 can be moved together laterally relative to the bracket 70 so that the fasteners 88 align with corresponding mounting holes in the bracket 80. The cover 82 can then be secured bracket 80 with access to the electrical connector 84 being provided through the aperture 86. This configuration may reduce the need for tight dimensional tolerances for the various elements of the electronics module 66 and its associated mounting structures.

Figure 4:
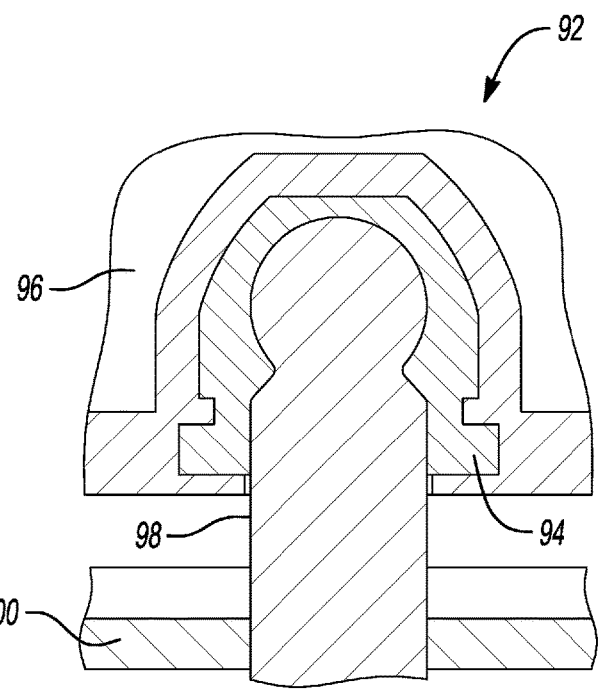
FIG. 4 shows a detailed view of a mounting arrangement in accordance with embodiments described herein.

FIG. 3 shows a portion of the first mounting arrangement 72 in more detail. Specifically, the flexible attachment 74 is shown with an elongated member 88 attached to the module housing 68, and a coupling 90 positioned in the bracket 70. Similar to the flexible attachments 36, 38 shown in FIG. 1, the flexible attachment 74 includes a relatively rigid elongated member 88 disposed inside a coupling 91 made from an elastomeric material. In contrast, FIG. 4 shows a flexible attachment 92 with a somewhat different configuration. In the embodiment shown in FIG. 4, a coupling 94 is disposed within a plastic housing 96, which may be, for example, a housing of an electronics module. The coupling 94 may be made from a flexible material, such as an elastomer, similar to the embodiments described above.

The flexible attachment 92 also includes an elongated member 98, which is attached to a bracket 100, which may be, for example, part of a support structure such as described above. In the embodiment shown in FIG. 4, the elongated member 98 may be made from metal, plastic, or other materials, and can be screwed, welded, riveted, snapped-in, or otherwise attached to the plate 100 by any method effective to achieve the desired attachment. In at least some of the embodiments described herein, an elongated member, such as the elongated member 98 may be relatively rigid, while the coupling may be relatively flexible, such as a coupling made from an elastomeric material. In other embodiments, an elongated member may be flexible while the coupling is relatively rigid. Alternatively, both the elongated member and the coupling may be flexible to provide a desired amount of movement in the first mounting arrangement. For example, an elongated member may be made from a metal material with a portion of the elongated member being configured with coils as a spring.

Figure 5:
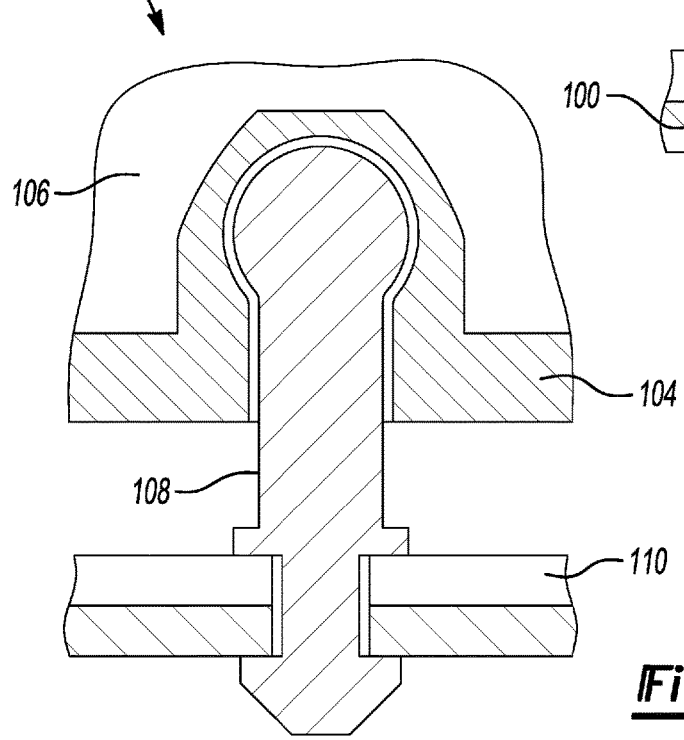
FIG. 5 shows a detailed view of another mounting arrangement in accordance with embodiments described herein.

FIG. 5 shows another flexible attachment 102 in accordance with embodiments described herein. Similar to the flexible attachment 92 shown in FIG. 4, the flexible attachment 102 includes a coupling 104 disposed in a housing 106, which may be, for example, a plastic housing of an electronics module. The flexible attachment 102 also includes elongated member 108, which is snapped into a plate 110, which may be part of a support structure such as described above. The elongated member may be made from a material such as metal or plastic, and may be rigid or flexible as necessary to achieve the desired attachment.

As described above in conjunction with FIG. 1, an elongated member such as the elongated member 40 may be integrally molded with a module housing, such as the module housing 16. Alternatively, it may be attached in a separate operation. If the elongated member 40 is screwed to the module housing 16, or otherwise separately attached and not integrally molded with the housing 16, access to the attachment point is required. Obtaining this access may be difficult with many electronics modules, which, for example, may not provide a straight-through access from the top of the housing to the bottom of the housing to facilitate attachment of the elongated member. Embodiments described herein address this issue as illustrated in FIG. 6.

Figure 6:
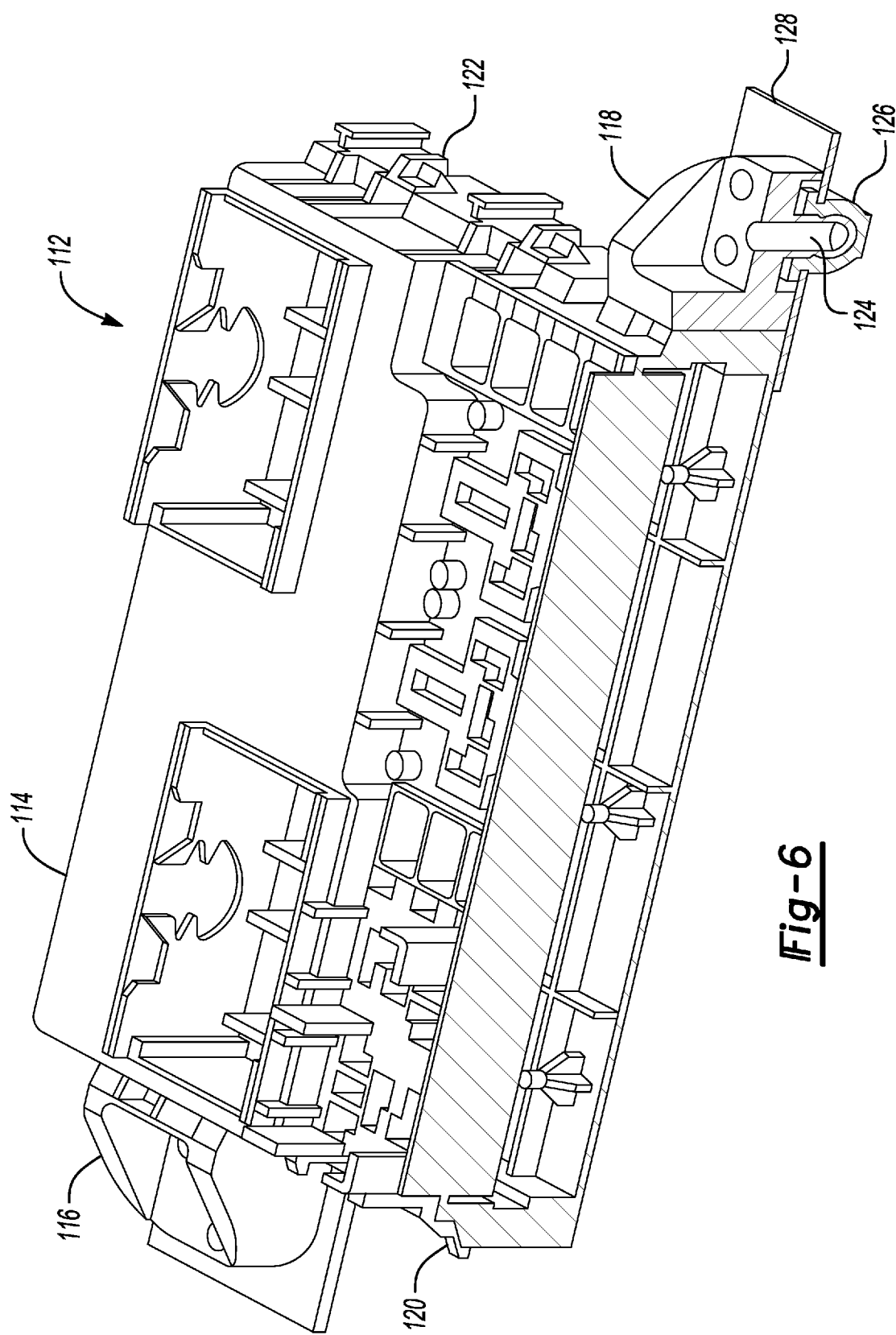
FIG. 6 shows a system for mounting an electronics arrangement in accordance with embodiments described herein.

As shown in FIG. 6 an electronics module 112—which may be, for example, a junction box used in an automotive vehicle—includes a housing 114. In this embodiment it may not be possible or desirable to integrally mold an elongated member to the housing 114 as part of a flexible attachment such as described above. It may also not be possible or desirable to separately attach an elongated member directly below the housing 114. Therefore, in this embodiment, two separate support members 116, 118 are attached to the module housing 114 at convenient locations, such as along opposite ends 120, 122, respectively.

In the embodiment shown in FIG. 6, the support members 116, 118 are configured to snap onto the housing 114, although in other embodiments, different attachment mechanisms may be used. As shown in FIG. 6, the support members 116, 118 extend outward from their respective ends 120, 122. The support member 118, which is shown in a cross-sectional view in FIG. 6, includes an integrally molded elongated member 124. Also shown in cross section is a coupling 126, which is positioned in a bracket 128, which may be part of a support structure as described above. The support member 116 may be configured the same as the support member 118, and together they provide a flexible mounting arrangement as described above. The use of separate support members, such as the support members 116, 118, allows systems as described herein to be used with electronics arrangements having geometries that may otherwise make it difficult or impossible to provide flexible attachments such as those described above.

While exemplary embodiments are described above, it is not intended that these embodiments describe all possible forms of the invention. Rather, the words used in the specification are words of description rather than limitation, and it is understood that various changes may be made without departing from the spirit and scope of the invention. Additionally, the features of various implementing embodiments may be combined to form further embodiments of the invention.

What is claimed is:

1. A system for mounting an electronics arrangement, comprising:
    a circuit assembly including a plurality of electronic devices;
    a first support structure for mounting the circuit assembly thereto;
    a second support structure;
    a first mounting arrangement attached to the circuit assembly and the first support structure; and
    a second mounting arrangement covering at least a portion of the circuit assembly and attached to the second support structure, and wherein the first mounting arrangement includes a flexible attachment having an elongated member disposed within a coupling, the flexible attachment connecting the circuit assembly and the first support structure such that the circuit assembly is movable relative to the first support structure to facilitate alignment of the circuit assembly with the second mounting arrangement when the second mounting arrangement is attached to the second support structure, and wherein the circuit assembly includes a housing, and the elongated member is attached to one of the housing or the first support structure and the coupling is attached to the other of the housing or the first support structure.

2. The system of claim 1, wherein the second mounting arrangement includes a plate having an aperture disposed therein, and wherein the circuit assembly is movable laterally relative to the first support structure such that a predetermined one of the electronic devices is aligned with the aperture when the second mounting arrangement is attached to the second support structure.

3. The system of claim 2, wherein the circuit assembly includes an electrical connector, and the aperture in the plate is positioned relative to the electrical connector when the second mounting arrangement is attached to the second support structure such that the electrical connector is accessible through the aperture in the plate.

4. The system of claim 1, wherein the circuit assembly is disposed in the housing when the first mounting arrangement is attached to the circuit assembly and the first support structure, and wherein the second mounting arrangement includes a housing cover attached to the housing.

5. The system of claim 4, wherein the circuit assembly includes an electrical connector and the housing cover includes an aperture disposed therein, and wherein the first mounting arrangement is configured to facilitate lateral movement of the circuit assembly relative to the first support structure when the circuit assembly is attached to the first support structure such that the electrical connector is aligned with the aperture and accessible through the aperture in the housing cover when the housing cover is attached to the housing.

6. A system for mounting an electronics arrangement, comprising:
a circuit assembly including a plurality of electronic devices;
a first support structure for mounting the circuit assembly thereto;
a first attachment arrangement connecting the circuit assembly and the first support structure and configured to allow at least lateral movement of the circuit assembly relative to the first support structure, the first attachment arrangement including an elongated member disposed within a coupling;
a second support structure; and
a second attachment arrangement connected to the second support structure and configured to inhibit movement of the circuit assembly, and
wherein the circuit assembly incudes an electronics module having a module housing and the elongated member is attached to one of the module housing or the first support structure and the coupling is attached to the other of the module housing or the first support structure.

7. The system of claim 6, wherein the first support structure includes the second support structure.

8. The system of claim 7, wherein the first support structure is a housing and the circuit assembly is attached to the housing by the first attachment arrangement, and wherein the second attachment arrangement includes a housing cover attached to the housing.

9. The system of claim 8, wherein the circuit assembly includes an electrical connector and the housing cover includes an aperture disposed therein, and wherein the first attachment arrangement is configured to facilitate lateral movement of the circuit assembly relative to the housing when the circuit assembly is attached to the housing such that the electrical connector is aligned with the aperture and accessible through the aperture in the housing cover when the housing cover is attached to the housing.

10. The system of claim 6, wherein the second attachment arrangement includes a plate having an aperture disposed therein, and wherein the circuit assembly is movable laterally relative to the first support structure such that a predetermined one of the electronic devices is aligned with the aperture when the plate is connected to the second support structure.

* * * * *